United States Patent
Pividori

(10) Patent No.: US 7,220,686 B2
(45) Date of Patent: May 22, 2007

(54) PROCESS FOR CONTACT OPENING DEFINITION FOR ACTIVE ELEMENT ELECTRICAL CONNECTIONS

(75) Inventor: Luca Pividori, Curno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/661,104

(22) Filed: Sep. 12, 2003

(65) Prior Publication Data
US 2004/0121589 A1    Jun. 24, 2004

(30) Foreign Application Priority Data
Sep. 12, 2002   (EP)   .................................. 02425558

(51) Int. Cl.
*H01L 21/31* (2006.01)
*H01L 21/469* (2006.01)
(52) U.S. Cl. ...................... 438/791; 438/761; 438/792; 257/E23.134; 257/E23.118; 257/E21.275
(58) Field of Classification Search ............... 438/792, 438/791, FOR. 395, 761; 257/E23.134, 257/E23.118, E21.275
See application file for complete search history.

(56) References Cited

U.S. PATENT DOCUMENTS

| | | | |
|---|---|---|---|
| 4,618,541 A | 10/1986 | Forouhi et al. | |
| 5,728,453 A * | 3/1998 | Wang et al. | 428/209 |
| 5,877,095 A | 3/1999 | Tamura et al. | |
| 6,166,439 A * | 12/2000 | Cox | 257/758 |
| 6,369,453 B1* | 4/2002 | Gao et al. | 257/786 |
| 2002/0063334 A1* | 5/2002 | Shin et al. | 257/758 |
| 2002/0111014 A1 | 8/2002 | Jeng et al. | |
| 2004/0004054 A1* | 1/2004 | Pradeep et al. | 216/13 |
| 2004/0048468 A1* | 3/2004 | Liu et al. | 438/687 |

OTHER PUBLICATIONS

European Search Report dated Feb. 14, 2003 for European Application No. 02425558.

* cited by examiner

*Primary Examiner*—Michelle Estrada
(74) *Attorney, Agent, or Firm*—Lisa K. Jorgenson; Stephen Bongini; Fleit, Kain, Gibbons, Gutman, Bongini & Bianco P.L.

(57) ABSTRACT

A method is provided for contact opening definition for active element electrical connections. According to the method, a layer of BPSG is formed on a surface of an integrated circuit, and a transparent layer of nitride UV is formed above the layer of BPSG. Preferably, the transparent layer of nitride UV is formed by deposition using an HDP process and has a thickness of less than about 500 Å. In one embodiment, after forming a transparent layer of nitride UV, two overlapped layers of BARC and resist are formed on the surface of the integrated circuit. Also provided is a machine-readable medium encoded with a program for contact opening definition for active element electrical connections.

19 Claims, 2 Drawing Sheets

PROCESS FOR CONTACT OPENING DEFINITION FOR ACTIVE ELEMENT ELECTRICAL CONNECTIONS

CROSS-REFERENCE TO RELATED APPLICATIONS

This application is based upon and claims priority from prior European Patent Application No. 02-425558.0, filed Sep. 12, 2002, the entire disclosure of which is herein incorporated by reference.

BACKGROUND OF THE INVENTION

1. Field of the Invention

The present invention relates to the fabrication of integrated circuits, and more particularly to a process for contact opening definition for the active element electrical connections.

2. Description of Related Art

The active elements of an integrated circuit are connected to other elements through contacts. The number of contacts in a typical integrated circuit can vary from hundreds of thousands to about ten million.

The dimension reduction of integrated circuits leads to the realization of contacts having smaller and smaller dimensions, and thus requiring more and more precise and delicate fabrication processes. Further, the possible presence of extraneous substances in the processing environment can alter and contaminate a fabrication process in progress.

SUMMARY OF THE INVENTION

In view of these drawbacks, it is an object of the present invention to overcome these drawbacks and to provide an improved process for forming contacts in an integrated circuit.

Briefly, one embodiment of the present invention provides a method for contact opening definition for active element electrical connections. According to the method, a layer of BPSG is formed on a surface of an integrated circuit, and a transparent layer of nitride UV is formed above the layer of BPSG. Preferably, the transparent layer of nitride UV is formed by deposition using an HDP process and has a thickness of less than about 500 Å.

Further embodiments of the present invention provide a machine-readable medium encoded with a program for contact opening definition for active element electrical connections.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
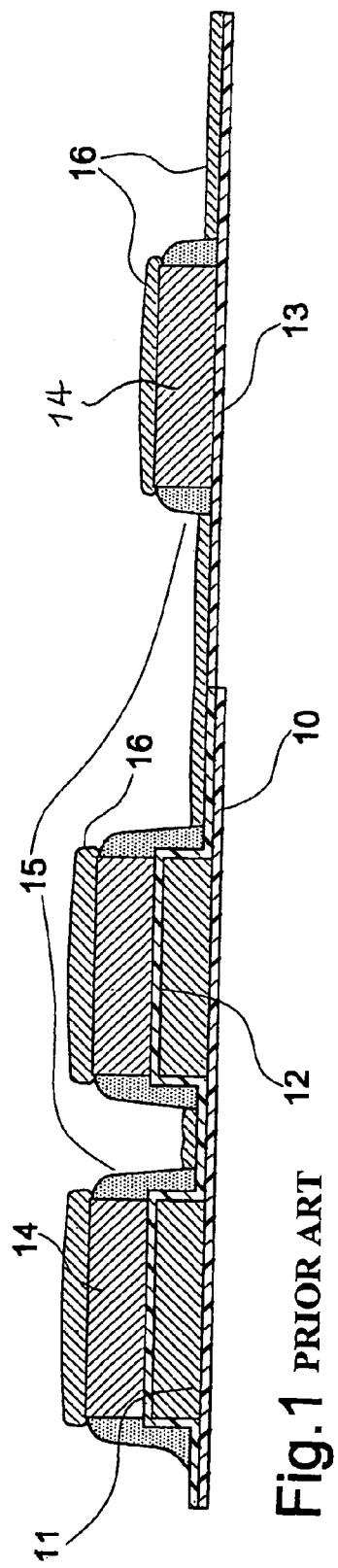
FIGS. 1 to 4 show cross-sections of a conventional integrated circuit during fabrication.

Preferred embodiments of the present invention will be described in detail herein below with reference to the attached drawings.

The process for fabricating an integrated circuit is typically composed of the following steps:

1) growth of an active (tunnel) oxide 10;
2) deposition and definition of a polysilicon layer 11 that constitutes the floating gate (poly1) only in the active matrix and its elimination from the other circuitry;
3) deposition of an interpoly dielectric layer 12, for instance of the ONO (Oxide Nitride Oxide) type;
4) through a mask (MATRIX mask), the etching (generally dry) of the deposited layers of interpoly dielectric (for instance, ONO) and polysilicon (poly1) of the floating gate memory cells is effected;
5) growth of one or more layers of gate active oxide 13;
6) deposition of a second polysilicon layer 14 (poly2);
7) definition of the matrix cells through exposure of the auto-alignment mask; and
8) definition of the gates of the transistors through exposure of the circuit mask, formation of spacers 15 (for instance of oxide or nitride), and if necessary the formation of a metallic conductive layer 16 (for instance of titanium salicide, or cobalt or tungsten silicide).

Such steps lead to an integrated circuit as shown in the cross-sectional view of FIG. 1. Subsequently the formation of the layers in which the contacts should be formed is effected through the following steps.

Figure 2:
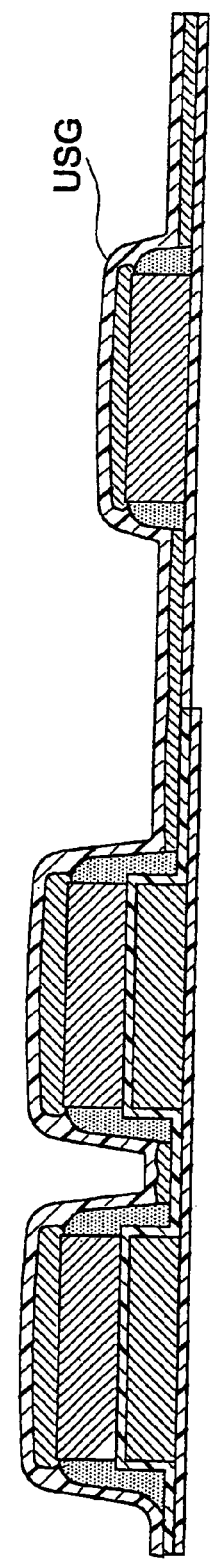

9) Deposition of an oxide layer of USG (Undoped Silicon Glass), for instance from an HDP (High Density Plasma) process and with a thickness in the range of about 500 Å–2500 Å, or of nitride (in which case a process known as "borderless" is used for the formation of the contacts), as shown in FIG. 2. The presence of this layer prevents the spreading in the silicon and in the gates of contaminants derived from the doped layers that are subsequently deposited.

Figure 3:
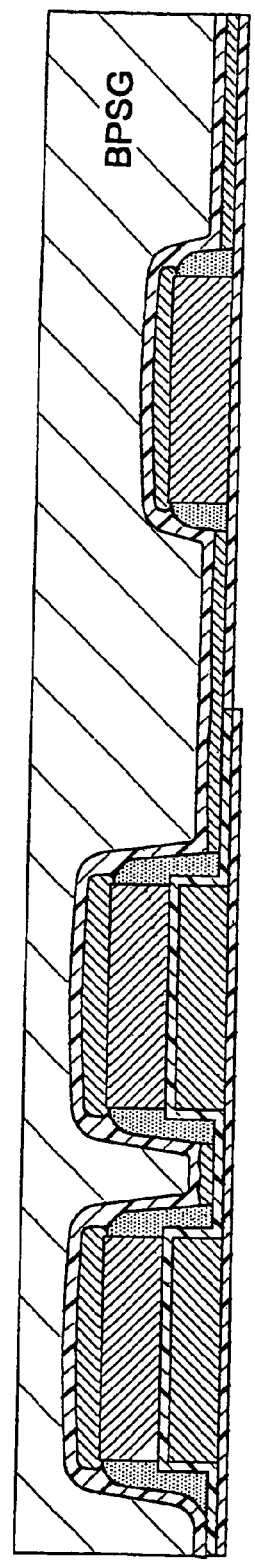

10) Deposition of a layer, for instance of BPSG (Boron Phosphorous Silicon Glass) (not necessary in circuits without non-volatile memories), generally through a SACVD (Sub Atmospheric Chemical Vapor Deposition) process with concentration of the type 2:9 being useful, especially for memory flash devices, as shown in FIG. 3.

11) Thermal treatment with RTA (Rapid Thermal Annealing) of the deposited BPSG layer.

12) Planarization of the premetal layer of USG and BPSG, for instance through CMP (Chemical Mechanical Polishing) technology.

At this point, according to the conventional process, the contact mask is exposed, which foresees two overlapped layers of BARC (Bottom Anti Reflecting Coating) and of resist, for the masks to be used in the exposure of the DUV (Deep Ultra Violet) type.

Such layers are necessary to allow the correct definition of the contacts according to the dimensional specifications required by the product. The presence of the BARC also avoids the contamination of the resist from the doped layer of BPSG, which if it happened would jeopardize the final result of the lithographic process.

Figure 4:
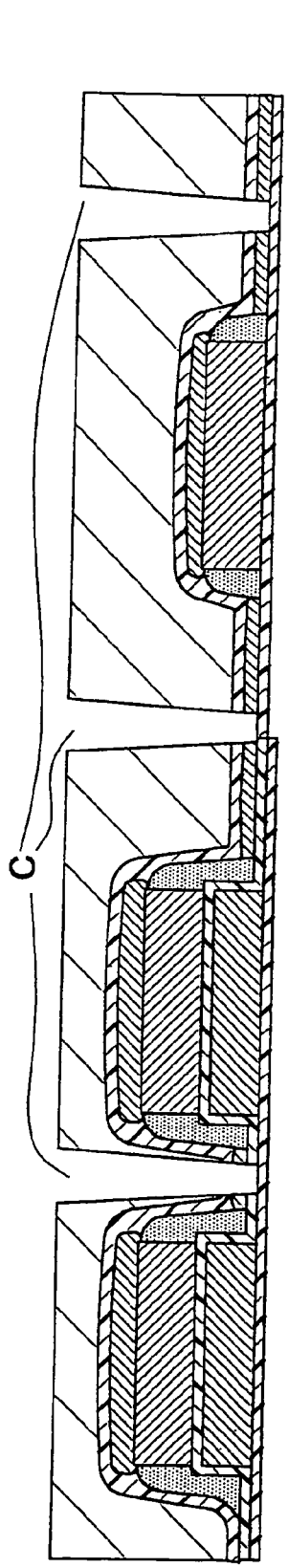

Then, the selective removal of the BPSG and USG layers is effected through a dry etching of the oxide layers, generally using a chemistry of the $CHF_3/CF_4/O_2$ type, usually used for the oxide etching at the contact level. After the contact hole C is formed in the oxide layers (see FIG. 4), it is filled with tungsten W through CVD deposition of the tungsten from $WF_6$ to form the tungsten W 'plug'. Generally, between the contact oxide and the tungsten W, a barrier layer of TiN (or Ti/TiN) is interposed from CVD (Chemical Vapor Deposition) or PVD (Physical Vapor Deposition) to avoid contaminations of $WF_6$ and diffusion of the tungsten W through the oxide. Through dry etching (selective with the Ti/TiN layer, which is the end-point) there is removed (etched back) the tungsten W deposited in excess, so as to give definitive form to the contact. The operations for the deposition of the AlCu metal layers and the definition of the circuit interconnections follow.

Figure 5:
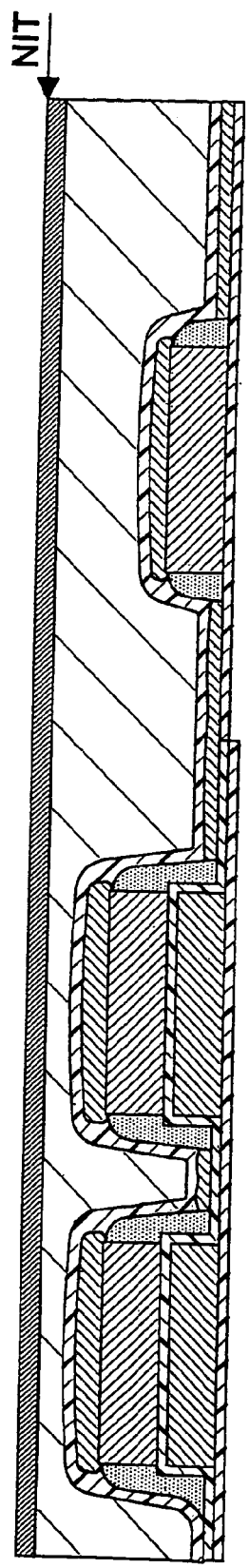
FIGS. 5 to 6 show cross-sections of an integrated circuit according to a preferred embodiment of the present invention during fabrication.

According to the present invention, after step 12 of the conventional process described above, instead of immediately exposing the contact mask, a layer NIT, for instance of transparent UV (Ultra Violet) nitride, is deposited, preferably with a thickness of less than about 500 Å, and more preferably between about 100 Å and 500 Å, as shown in FIG. 5. The layer NIT is preferably deposited through an HDP process, but any other process that is able to deposit a uniform layer at low temperature (for instance, <500° C.) can be utilized, for example a Chemical Vapor Deposition (CVD) process. The deposited layer NIT is preferably insulating in order to avoid any possible short circuit.

After that, two overlapped layers of BARC and of resist are formed, when necessary.

The deposited layer NIT must be made of a material that allows a high selectivity with the BPSG during the contact etching, so that once the resist is worn out (or has been consumed) it develops the same function of superior barrier layer (that is, above the BPSG layer) in comparison to the etching chemistry. For this purpose, it is advantageous that the deposited layer is for instance a transparent UV nitride that has high selectivity with the BPSG and does not prevent the reliable performance of the memory cell, particularly if the cell is of the flash type.

The function of such a layer is that of avoiding the direct contact of the BARC and resist with the BPSG, especially in case of prolonged rest of the wafers with BARC and resist already deposited and before their working (contact etching). In such a way, the defective formation called "corrosion" of the BPSG layer, which makes impossible the contact definition and therefore reduces yield, is avoided.

Additionally, such a layer avoids the formation of contacts "with double edge", which is critical when the contact dimension is on the order of 0.2 µm or smaller and the distance between the contacts is on the order of 0.5 µm.

Figure 6:
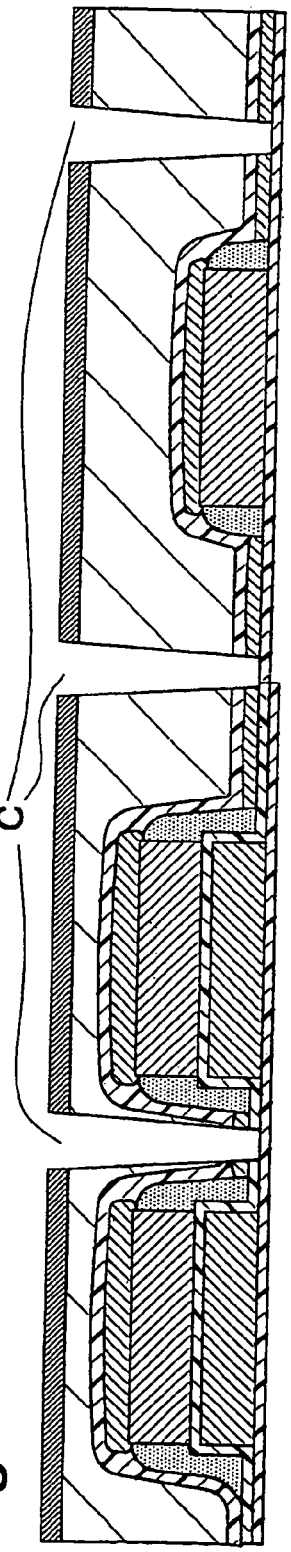

Once the barrier layer has been deposited in accordance with the present invention, the normal operations of mask exposure of the contact and its etching are effectuated, as shown in FIG. 6. Obviously the contact etching chemistry is modified in order to correctly etch the additional protective layer in the first step (being in this exemplary case a nitride layer, a dry etching of the protective layer having a chemistry of the type $C_4F_8/O_2$ can advantageously be used, to allow an elevated selectivity with the BPSG underlying oxide), and then proceeding in a standard manner, for instance with a chemistry of the type $CHF_3/O_2$, to etch oxide once arrived at the BPSG.

The method of the present invention can be embedded in hardware, software, or a combination of hardware and software. Any processor, controller, or other apparatus adapted for carrying out the functionality described herein is suitable. A typical combination of hardware and software could include a general purpose processor (or a controller) with a computer program that, when loaded and executed, carries out the functionality described herein.

The present invention can also be embedded in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after either or both of the following a) conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for contact opening definition for active element electrical connections, said method comprising the steps of:

forming a layer of BPSG on a surface of an integrated circuit;

forming a transparent layer of nitride UV above the layer of BPSG; and after the step of forming the transparent layer of nitride UV, etching the transparent layer of nitride UV so as to form at least one contact opening.

2. The method according to claim 1, further comprising the step of:

after the step of forming a transparent layer of nitride UV and before the etching step, forming two overlapped layers of BARC and resist on the surface of the integrated circuit.

3. The method according to claim 2, wherein the etching step is performed after the step of forming two overlapped layers of BARC and resist.

4. The method according to claim 3, further comprising the step of:

before the step of forming a layer of BPSG, forming a USG oxide layer on the surface of the integrated circuit, the USG oxide layer having a thickness of between about 500 Å and 2500 Å.

5. The method according to claim 1, further comprising the step of:
   before the step of forming a layer of BPSG, forming a USG oxide layer on the surface of the integrated circuit, the USG oxide layer having a thickness of between about 500 Å and 2500 Å.

6. The method according to claim 1, wherein in the step of forming the transparent layer of nitride UV, the transparent layer of nitride UV is formed by deposition using an HDP process.

7. The method according to claim 6, wherein the transparent layer of nitride UV has a thickness of between about 100 Å and 500 Å.

8. The method according to claim 1, wherein in the step of forming the transparent layer of nitride UV, the transparent layer of nitride UV is formed by deposition using a CVD process.

9. The method according to claim 8, wherein the transparent layer of nitride UV has a thickness of between about 100 Å and 500 Å.

10. The method according to claim 1, wherein the transparent layer of nitride UV has a thickness of less than about 500 Å.

11. The method according to claim 1, wherein the transparent layer of nitride UV has a thickness of between about 100 Å and 500 Å.

12. The method according to claim 1, wherein the transparent layer of nitride UV has a thickness of between about 200 Å0 and 500 Å.

13. A machine-readable medium encoded with a program for contact opening definition for active element electrical connections, said program containing instructions for performing the steps of:
   forming a layer of BPSG on a surface of an integrated circuit;
   forming a transparent layer of nitride UV above the layer of BPSG; and
   after the step of forming the transparent layer of nitride UV, etching the transparent layer of nitride UV so as to form at least one contact opening.

14. The machine-readable medium according to claim 13, wherein the program further contains instructions for performing the step of:
   after the step of forming a transparent layer of nitride UV, forming two overlapped layers of BARC and resist on the surface of the integrated circuit.

15. The machine-readable medium according to claim 13, wherein the program further contains instructions for performing the step of:
   before the step of forming a layer of BPSG, forming a USG oxide layer on the surface of the integrated circuit, the USG oxide layer having a thickness of between about 500 Å and 2500 Å.

16. The machine-readable medium according to claim 13, wherein in the step of forming the transparent layer of nitride UV, the transparent layer of nitride UV is formed by deposition using an HDP process.

17. The machine-readable medium according to claim 13, wherein in the step of forming the transparent layer of nitride UV, the transparent layer of nitride UV is formed by deposition using a CVD process.

18. The machine-readable medium according to claim 13, wherein the transparent layer of nitride UV has a thickness of less than about 500 Å.

19. The machine-readable medium according to claim 13, wherein the transparent layer of nitride UV has a thickness of between about 100 Å and 500 Å.

\* \* \* \* \*